US007535752B2

(12) United States Patent
Kawasumi

(10) Patent No.: US 7,535,752 B2
(45) Date of Patent: May 19, 2009

(54) SEMICONDUCTOR STATIC RANDOM ACCESS MEMORY DEVICE

(75) Inventor: Atsushi Kawasumi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 11/712,254

(22) Filed: Feb. 28, 2007

(65) Prior Publication Data

US 2007/0211521 A1   Sep. 13, 2007

(30) Foreign Application Priority Data

Feb. 28, 2006   (JP)   ............................. 2006-053608

(51) Int. Cl.
*G11C 11/00* (2006.01)
(52) U.S. Cl. .................... 365/154; 365/49.11; 365/188; 365/202; 365/205; 365/230.08; 365/233.19
(58) Field of Classification Search ............. 365/49.11, 365/188, 202, 205, 230.08, 233.19, 154
See application file for complete search history.

(56) References Cited

U.S. PATENT DOCUMENTS

| 5,930,163 | A | 7/1999 | Hara et al. |
| 7,009,871 | B1 | 3/2006 | Kawasumi |
| 7,176,125 | B2 * | 2/2007 | Liaw ........................... 438/637 |
| 2005/0146947 | A1 * | 7/2005 | Higeta et al. ........... 365/189.07 |
| 2005/0167700 | A1 * | 8/2005 | Abbott ....................... 257/202 |
| 2006/0039180 | A1 * | 2/2006 | Kawasumi .................. 365/154 |

* cited by examiner

*Primary Examiner*—Huan Hoang
*Assistant Examiner*—Fernando N Hidalgo
(74) *Attorney, Agent, or Firm*—Sprinkle IP Law Group

(57) ABSTRACT

According to an aspect of the invention there is provided a semiconductor memory device, including a first inverter being composed of a first P-channel MOS transistor, a first N-channel MOS transistor, a second inverter being composed of a second p-channel MOS transistor and a second N-channel transistor, a data-retaining portion having a third N-channel MOS transistor, a fourth N-channel MOS transistor, a fifth N-channel MOS transistor and a sixth N-channel MOS transistor, a data-reading portion for reading out data stored in the data-retaining portion via a first bit line, including at least one N-channel MOS transistor, wherein gate widths of the fifth N-channel MOS transistor and the sixth N-channel MOS transistor, respectively, is larger than gate widths of the first N-channel MOS transistor, the second N-channel MOS transistor, the third N-channel MOS transistor, the fourth N-channel MOS transistor, the first P-channel MOS transistor and the second P-channel MOS transistor, respectively.

4 Claims, 5 Drawing Sheets

SEMICONDUCTOR STATIC RANDOM ACCESS MEMORY DEVICE

CROSS REFERENCE TO RELATED APPLICATION

This application is based upon and claims the benefit of priority from the prior Japanese Patent Application No. JP2006-053608, filed on Feb. 28, 2006; the entire contents of which are incorporated herein by reference.

FIELD OF THE INVENTION

The present invention relates to a semiconductor memory device, and in particular, to a layout of a semiconductor memory cell used in an SRAM (Static Random Access Memory).

DESCRIPTION OF THE BACKGROUND

In an SRAM, Refresh operation to retain data is not performed, therefore, the SRAM has a higher operation speed as comparing with a DRAM (Dynamic Random Access Memory). From view point of the operation speed, SRAM is applied to a cache memory or the like. Conventionally, an SRAM memory cell is composed of six transistors, that is, two road P-channel MOS transistors, two driver N-channel MOS transistors and two transfer N-channel MOS transistors. The SRAM memory cell has two inverters and each inverter is composed of one of the road P-channel MOS transistors and one of the driver N-channel MOS transistors (for example, Japanese Patent Publication (Kokai) No. P2004-273972, P11, FIG. 2).

Recently, high packing density in memory capacity and low voltage in power supply have been progressed in SRAM technology, which lead to cause deteriorating stability of storing data. As a method for improvement of the stability of storing data, increasing a number of transistors above six transistors in the SRAM cell have been proposed (for example, ISSCC (International Solid-State Circuits Conference), No. 34.4, 2006).

However, the method mentioned above has several problems. For example, as a number of elements in the SRAM cell is larger than that in the DRAM cell, an area in the SRAM cell is larger than that in a DRAM cell only having one transistor and one capacitor. Further, larger cell area lead to increasing a cost of SRAM memory product.

SUMMARY OF THE INVENTION

According to an aspect of the invention, there is provided, a semiconductor memory device, including a first inverter being composed of a first P-channel MOS transistor formed at a high potential power supply side and a first N-channel MOS transistor formed at a low potential power supply side, a second inverter being composed of a second P-channel MOS transistor formed at the high potential power supply side and a second N-channel transistor formed at the low potential power supply side, an input of the second inverter connecting with an output of the first inverter, an output of the second inverter connecting with an input of the first inverter, a data-retaining portion having a third N-channel MOS transistor and a fourth N-channel MOS transistor, the third N-channel MOS transistor having a source connecting with the output of the first inverter, a drain connecting with a first bit line, a gate connecting with a word line and the fourth N-channel MOS transistor having a source connecting with the output of the second inverter, a drain connecting with a second bit line paired with the first bit line and a gate connecting with the word line, a data-reading portion having a first group of transistors including at least one N-channel MOS transistor, data-reading portion reading out data stored in the data-retaining portion via the first bit line, a first P-well region including the first N-channel MOS transistor, the third N-channel MOS transistor and the first group of transistors, a second P-well region including the second N-channel MOS transistor and the fourth N-channel MOS transistor, an N-well region being interposed between the first P-well region and the second P-well region, the N-well region adjoining the first group of transistors in the first P-well region, the N-well region having the first P-channel MOS transistor and the second P-channel MOS transistor.

Further, another aspect of the invention, there is provided, a semiconductor memory device, including a first inverter being composed of a first P-channel MOS transistor formed at a high potential power supply side and a first N-channel MOS transistor formed at a low potential power supply side, a second inverter being composed of a second P-channel MOS transistor formed at the high potential power supply side and a second N-channel transistor formed at the low potential power supply side, an input of the second inverter connecting with an output of the first inverter, an output of the second inverter connecting with an input of the first inverter, a data-retaining portion having a third N-channel MOS transistor and a fourth N-channel MOS transistor, the third N-channel MOS transistor having a source connecting with the output of the first inverter, a drain connecting with a first bit line, a gate connecting with a word line and the fourth N-channel MOS transistor having a source connecting with the output of the second inverter, a drain connecting with a second bit line paired with the first bit line and a gate connecting with the word line, a first data-reading portion having a first group of transistors including at least one N-channel MOS transistor, data-reading portion reading out data stored in the data-retaining portion via the first bit line, a second data-reading portion having a second group of transistors including at least one N-channel MOS transistor, the second data-reading portion reading data stored in the data-retaining portion via the second bit line, a first P-well region including the first N-channel MOS transistor, the third N-channel MOS transistor and the first group of transistors, a second P-well region including the second N-channel MOS transistor, the fourth N-channel MOS transistor and the second group of transistors, an N-well region being interposed between the first P-well region and the second P-well region, the N-well region adjoining the first group of transistors in the first P-well region and the second group of transistors in the second P-well region, the N-well region having the first P-channel MOS transistor and the second P-channel MOS transistor.

Further, another aspect of the invention, there is provided, a semiconductor memory device, including a SRAM cell including a data-retaining portion and a data-reading portion, the data-retaining portion being composed of two P-channel MOS transistors and four N-channel MOS transistors, the data-reading portion being composed of a plurality of N-channel MOS transistors, the SRAM cell including a first diffusion layer being configured parallel to the SRAM cell, the first diffusion layer having two columns being configured at a center portion in the SRAM cell, each column having one of the two P-channel MOS transistors, a second diffusion layer being configured parallel to the SRAM cell, the second diffusion layer having at least one column in an upper region and a lower region, respectively, each column selectively having at least one of the plurality of N-channel MOS transistors, a plurality of gate layers being configured at an interval of ½ pitch of the SRAM cell along word line direction or bit line direction, the plurality of gate layers crossing to the diffusion layer, a contact layer being configured at an interval of ¼ pitch of the SRAM cell along word line direction or bit line direction, an m-th layer interconnection, where m is integral and above one, electrically connecting between the transistors, and the (m+1)-th layer interconnection electrically connecting through a via with a high potential power supply interconnection, a low potential power supply interconnection, a bit line interconnection and a word line interconnection of the m-th layer interconnection being configured over the SRAM cell.

Further, another aspect of the invention, there is provided, a semiconductor memory device, including a first SRAM cell, a second SRAM cell, a third SRAM cell, a fourth SRAM cell, a (m+1)-th layer interconnection, where m is integral and above one, electrically connecting through a via between a high potential power supply interconnection, a low potential power supply interconnection, a bit line interconnection and a word line interconnection configured over the first SRAM cell, the second SRAM cell, the third SRAM cell and the fourth SRAM cell, wherein the first SRAM cell, the second SRAM cell, the third SRAM cell and the fourth SRAM cell are adjacently disposed each other and share the cell original point, the first SRAM cell providing a first data-retaining portion and a first data-reading portion, the first data-retaining portion being composed of two P-channel MOS transistors and four N-channel MOS transistors, the first data-reading portion being composed of a plurality of N-channel MOS transistors, the gates of the transistors in the SRAM cell being configured at an interval of ½ pitch along X-direction or Y-direction, an m-th layer interconnection electrically connecting between the transistors in the first SRAM cell, the second SRAM cell being adjacently located at the first SRAM cell, the second SRAM cell providing a second data-retaining portion and a second data-reading portion, the second data-retaining portion being composed of two P-channel MOS transistors and four N-channel MOS transistors, the second data-reading portion being composed of a plurality of N-channel MOS transistors, the gates of the transistors in the SRAM cell being configured at an interval of ½ pitch along X-direction or Y-direction, the m-th layer interconnection electrically connecting between the transistors in the second SRAM cell, the third SRAM cell being adjacently located at the second SRAM cell, the third SRAM cell providing a third data-retaining portion and a third data-reading portion, the third data-retaining portion being composed of two P-channel MOS transistors and four N-channel MOS transistors, the third data-reading portion being composed of a plurality of N-channel MOS transistors, the gates of the transistors in the SRAM cell being configured at an interval of ½ pitch along X-direction or Y-direction, the m-th layer interconnection electrically connecting between the transistors in the second SRAM cell, the fourth SRAM cell being adjacently located at the third SRAM cell, the fourth SRAM cell providing a fourth data-retaining portion and a fourth data-reading portion, the fourth data-retaining portion being composed of two P-channel MOS transistors and four N-channel MOS transistors, the fourth data-reading portion being composed of a plurality of N-channel MOS transistors, the gates of the transistors in the SRAM cell being configured by an interval of ½ pitch along X-direction or Y-direction, the m-th layer interconnection electrically connecting between the transistors in the fourth SRAM cell.

DETAILED DESCRIPTION OF THE INVENTION

Figure 1:
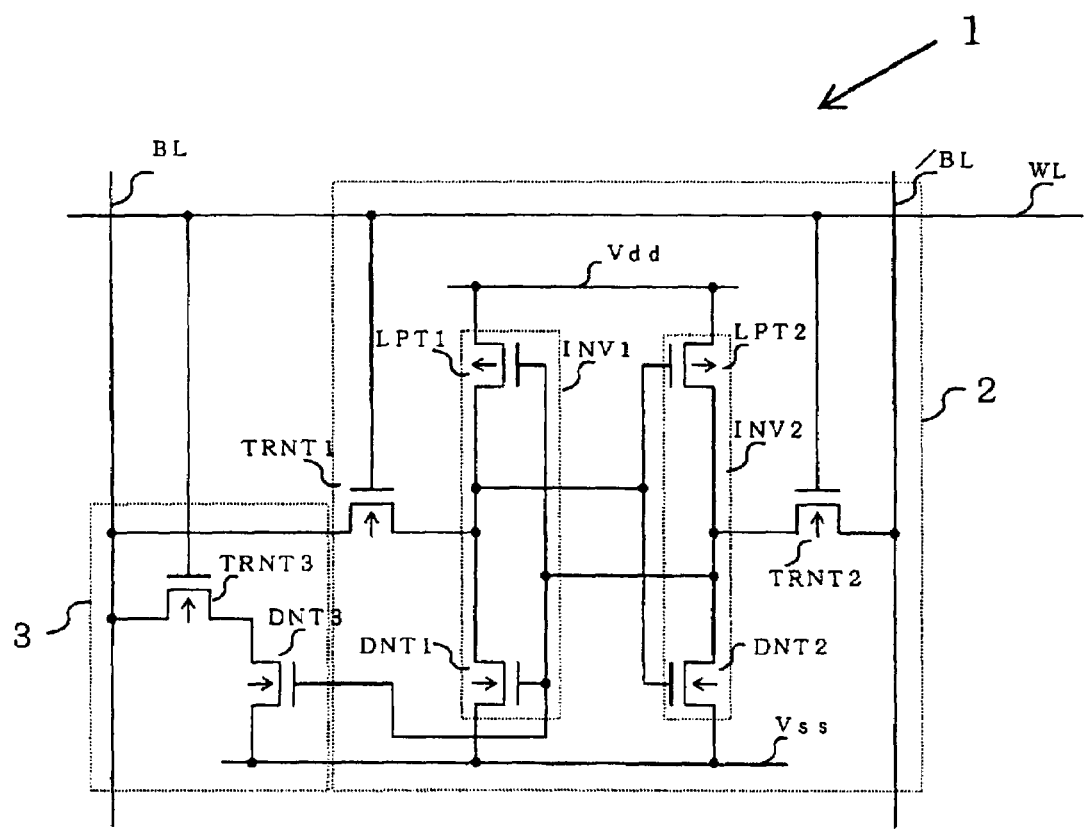
FIG. 1 is a schematic circuit design diagram showing a SRAM cell portion in a first embodiment of the present invention.

Embodiments of the present invention will be described below in detail with reference to the drawing mentioned above.

FIRST EMBODIMENT

First, according to a first embodiment of the present invention, a semiconductor memory device is explained with reference to FIGS. 1-3. FIG. 1 is a schematic circuit diagram showing a SRAM (Static Random Access Memory) cell portion. In this embodiment, the SRAM cell is composed of eight transistors.

As shown in FIG. 1, a data-retaining portion 2 composed of six transistors and a data-reading portion 3 composed of two transistors are configured in a SRAM cell portion 1. Here, a plurality of SRAM cell portions 1 is repeatedly disposed in a SRAM. As an operation of the SRAM cell composed of six transistor, data are written into the data-retaining portion 2 through a word line via a transfer transistor and are read out from the data-retaining portion 2 through a bit line via a transfer transistor. The data-reading portion 3 is located for improving capability (drive capability) on reading out data via a bit line, so that stability on storing data in the SRAM is improved.

A driver N-channel MOS(NMOS) transistor DNT1, a, driver NMOS transistor DNT2, a road P-channel MOS (PMOS) transistor LPT1, a road PMOS transistor LPT2, a transfer NMOS transistor TRNT1, and a transfer NMOS transistor TRNT2 are configured in the data-retaining portion 2. A MOS transistor having a source, a drain and a gate is called as a MOSFET (Metal Oxide Semiconductor Field Effect Transistor). Instead of MOS transistor, SRAM cell portion 1 may be composed of MISFET (Metal Insulator Semiconductor Field Effect Transistor) by using an insulator as a gate.

The source of the road PMOS transistor LPT1 (first PMOS transistor) is connected to a high potential power supply Vdd, the drain of the road PMOS transistor LPT1 is connected to the drain of the driver NMOS transistor DNT1 (first NMOS transistor), and the gate of the road PMOS transistor LPT1 is connected to the gate of the driver NMOS transistor DNT1. The source of the driver NMOS transistor DNT1 is connected to a low potential power supply Vss as earth potential. An inverter INV1 (first inverter) are composed of the road PMOS transistor LPT1 and the driver NMOS transistor DNT1.

The source of the road PMOS transistor LPT2 (second PMOS transistor) is connected to the high potential power supply Vdd, the drain of the road PMOS transistor LPT2 is connected to the drain of the driver NMOS transistor DNT2 (second NMOS transistor), the gate of the road PMOS transistor LPT2 is connected to the gate of driver NMOS transistor DNT2. The source of the driver NMOS transistor DNT2 is connected to the low potential power supply Vss as earth potential. An inverter INV2 (second inverter) is composed of the road PMOS transistor LPT2 and the driver NMOS transistor DNT2.

One of the source or the drain (as electrical current pass) of the transfer NMOS transistor TRNT1 (third NMOS transistor) is connected to the bit line BL, and the other of the source or the drain (as electrical current pass) is connected between the drain of the road PMOS transistor LPT1 and the drain of the driver NMOS transistor DNT, and the gate of the transfer NMOS transistor TRNT1 is connected to the word line WL.

One of the source or the drain (as electrical current pass) of the transfer NMOS transistor TRNT2 (fourth NMOS transistor) is connected to a bit line/BL paired with the bit line BL, and the other of the source or the drain (as electrical current pass) is connected between the drain of the road PMOS transistor LPT2 and the drain of the driver NMOS transistor DNT2, the gate of the transfer NMOS transistor TRNT2 is connected to the word line WL. Here, transfer NMOS transistors TRNT 1 and TRNT 2 act as elements for reading out data and writing in data.

The gates of the road PMOS transistor LPT1 and the driver NMOS transistor DNT1 is connected to the drains of the road PMOS transistor LPT2 and the driver NMOS transistor DNT2, respectively. The gates of road PMOS transistor LPT2 and the driver NMOS transistor DNT2 are connected to the transfer NMOS transistor TRN2. The drain of road PMOS transistor LPT1 is connected to the drain of the driver NMOS transistor DNT1 and the transfer NMOS transistor TRNT1.

A driver NMOS transistor DNT3 and a transfer NMOS transistor TRNT3 are configured in the reading portion 3. Improvement of capability on reading information in the reading portion 3 leads to improvement stability on storing data in the SRAM via the bit line.

One of the source or the drain (as electrical current pass) of the transfer NMOS transistor TRNT3 (fifth NMOS transistor) is connected to the bit line BL, and the other of the source or the drain (as electrical current pass) of the transfer NMOS transistor TRNT3 is connected to the drain of the driver NMOS transistor DNT3, and the gate of the transfer NMOS transistor TRNT3 is connected to the word line WL. The source of the driver NMOS transistor DNT3 (sixth NMOS transistor) is connected to the low potential power supply Vss, the gate of the driver NMOS transistor DNT3 is connected to the gate of the road PMOS transistor LPT1 and the driver NMOS transistor DNT1.

Here, for improvement of capability on reading data, the driver NMOS transistor DNT3 and the transfer NMOS transistor TRNT3 in the data-reading portion 3 are arranged. For example, absolute value of threshold voltage is arranged to lower voltage than that of the transistors in the data-retaining portion 2 so as to improve drive capability at "ON" state.

Figure 2:
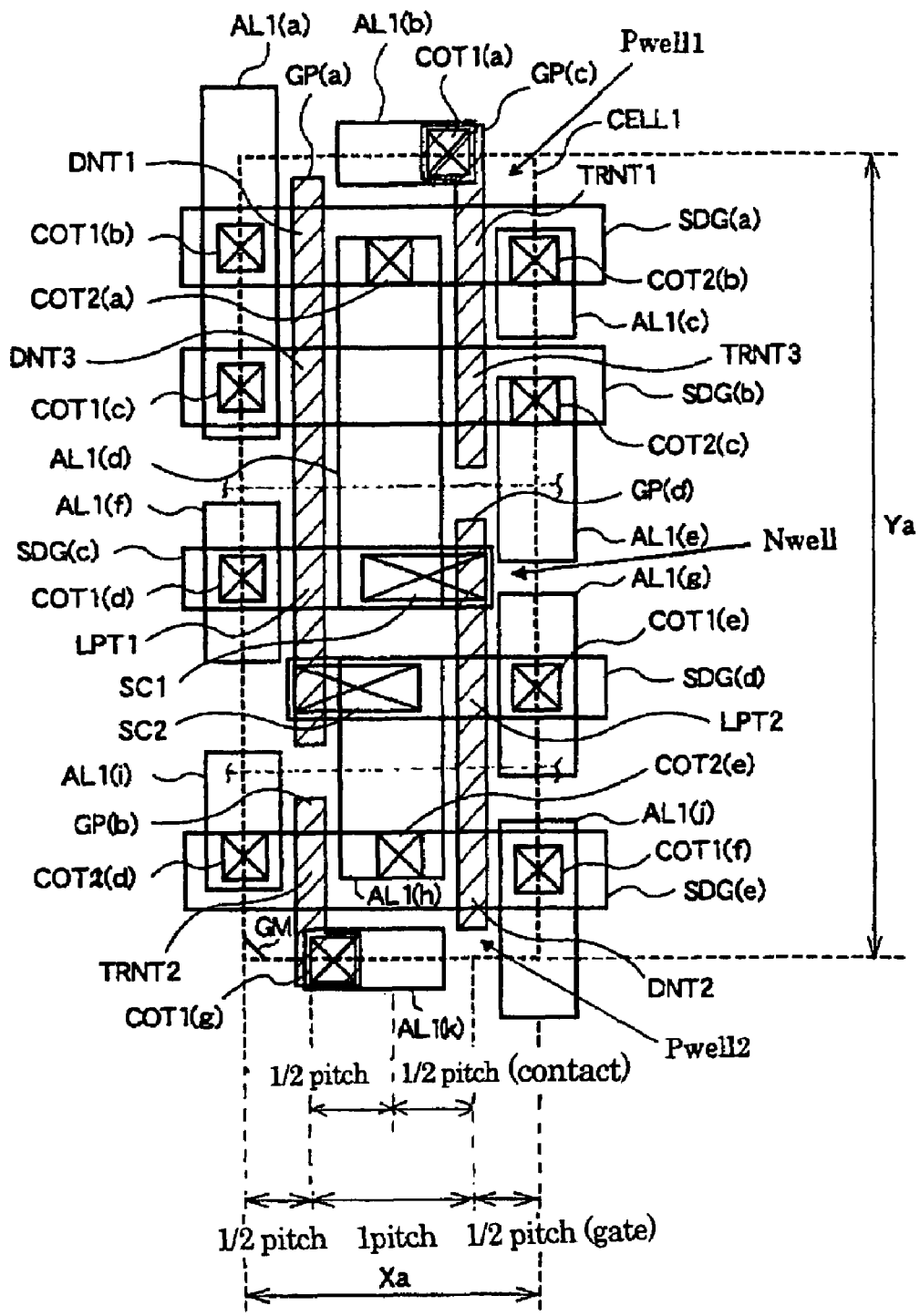
FIG. 2 is a schematic circuit layout showing the SRAM cell portion in the first embodiment of the present invention.
Figure 3:
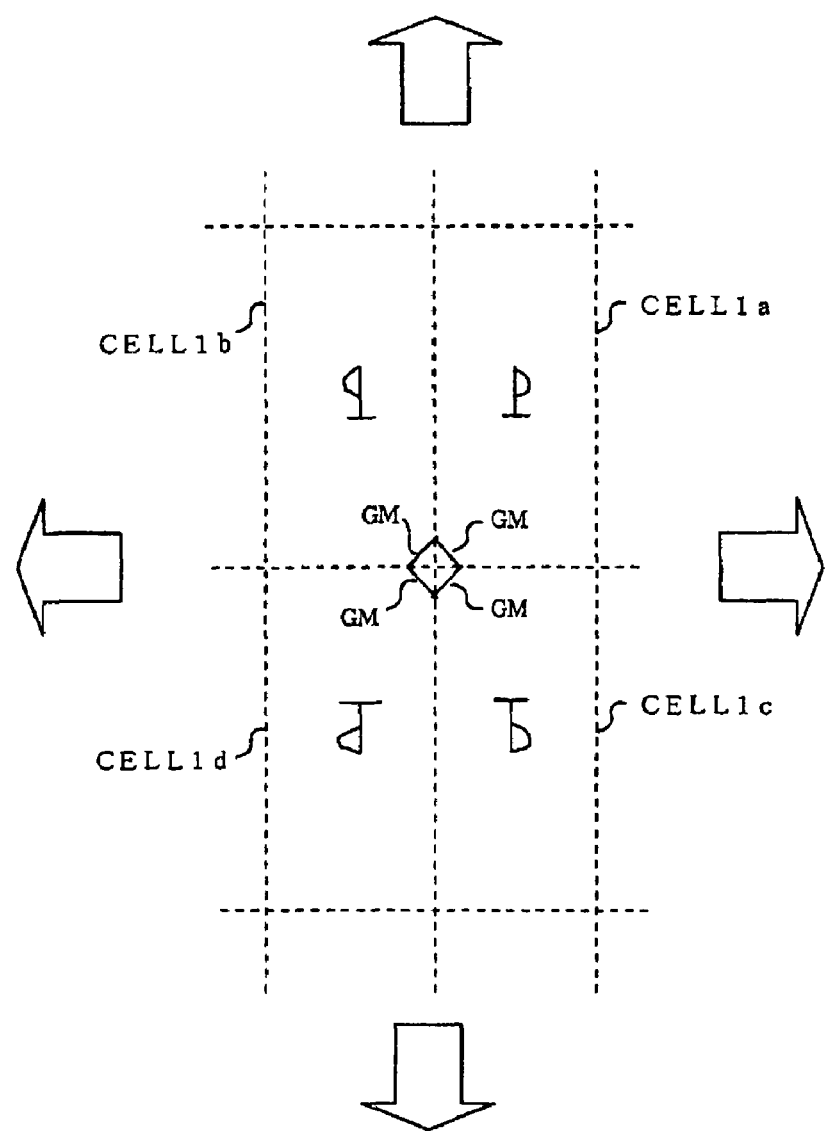
FIG. 3 is a schematic SRAM cell layout showing the SRAM cell in the first embodiment of the present invention.
Figure 4:
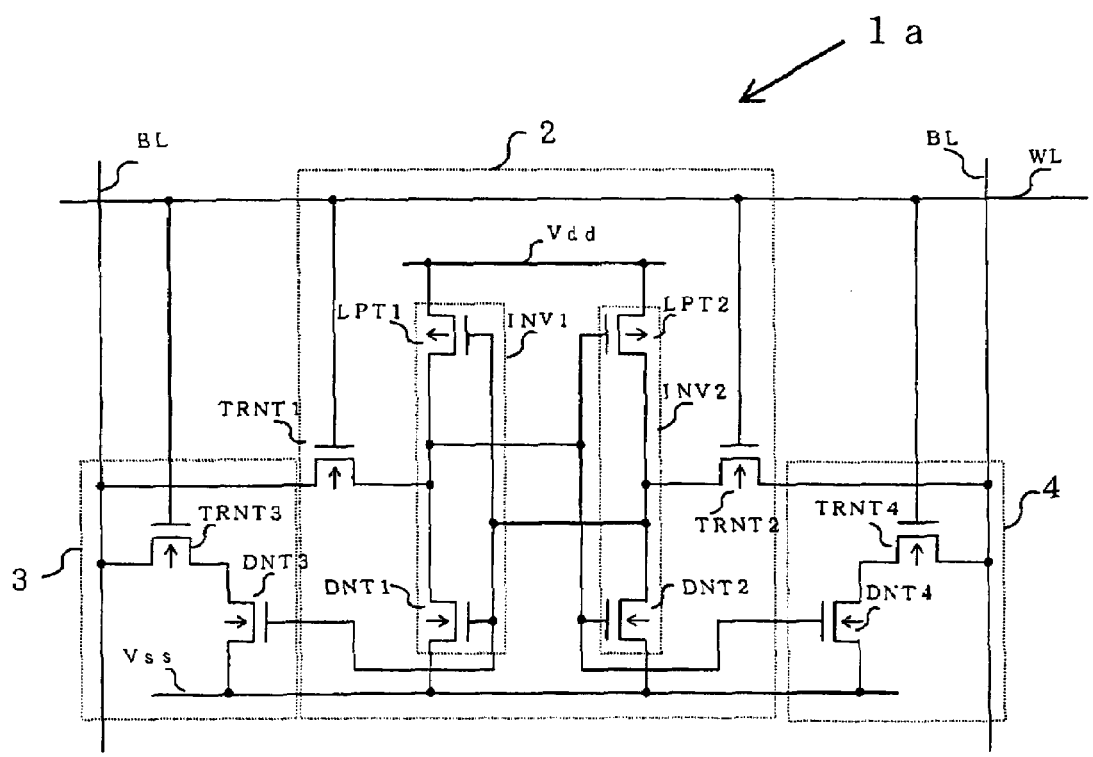
FIG. 4 is a schematic circuit design diagram showing a SRAM cell portion in a second embodiment of the present invention.
Figure 5:
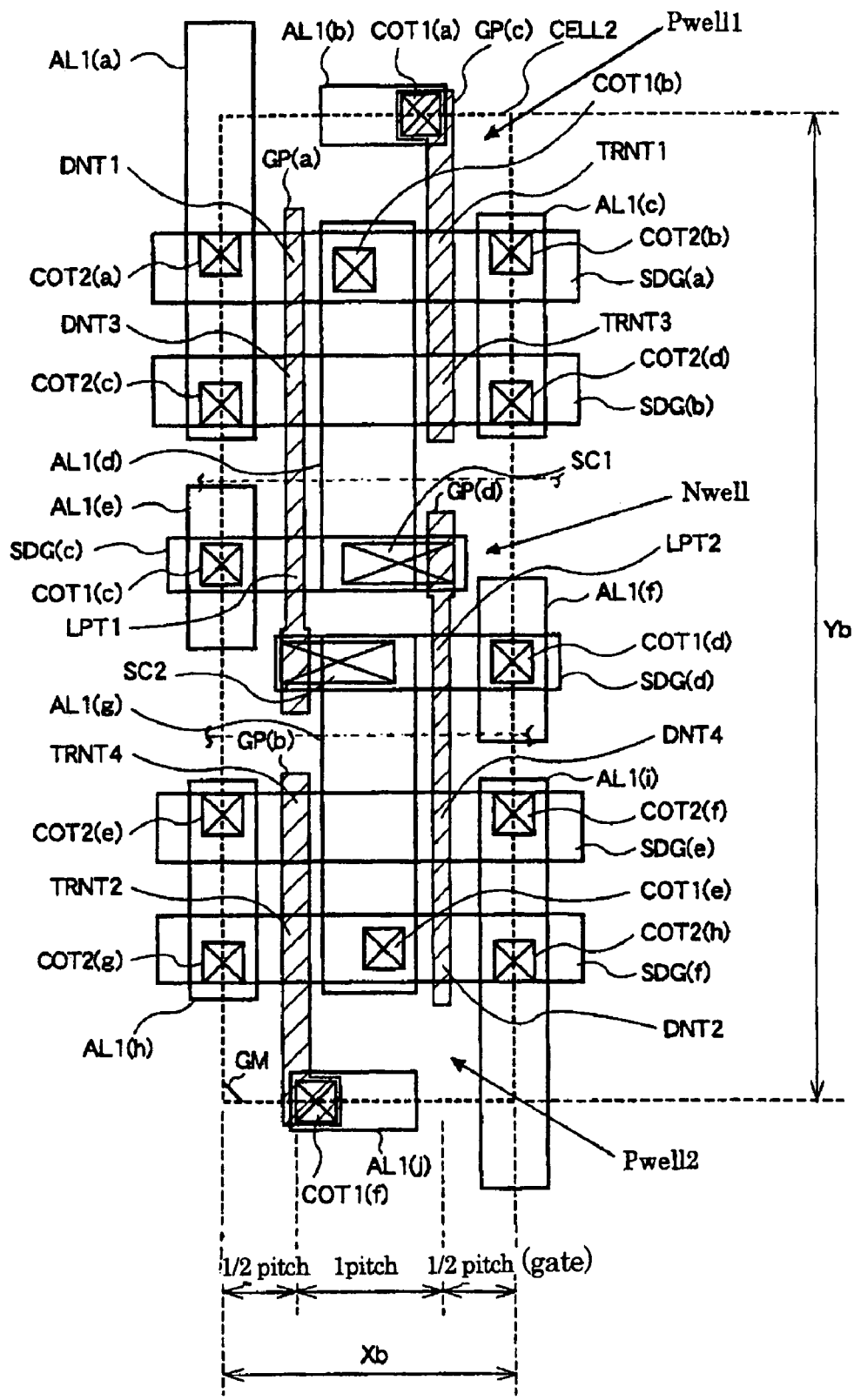
FIG. 5 is a circuit schematic layout showing the SRAM cell portion in the second embodiment of the present invention.

Next, a SRAM cell composed of the SRAM cell portions is explained as reference to FIG. 2 and FIG. 3. FIG. 2 is a schematic circuit layout showing the SRAM cell portion and FIG. 3 is a schematic SRAM cell layout showing the SRAM cell.

As shown in FIG. 2, the SRAM cell CELL1 is a rectangular shape having sizes of Xa along lateral direction and Ya along longitudinal direction, and a plurality of SRAM cells CELL1 are repeatedly disposed. In the SRAM cell CELL1, a first-layer interconnection is used for connecting between element transistors. Here, the layer is displayed in FIG. 2. The layer is located at a periphery area of the SRAM cell CELL1. A cell original point GM is located at the lower left.

The SRAM cell CELL1 as shown in FIG. 2 is the rectangular shape being a longer side along longitudinal direction than a side along lateral direction. The SRAM cell CELL1 has an N well region N well composed of an N well layer, a first P well region P well and a second P well region P well 2 composed of P well layers, diffusion layers SDG(a) to (e) composed of a diffusion layer, gate GP(a) to (d) composed of a gate layer, contact COT1(a) to (g), contact COT2(a) to (e), shared contact SC1 and shared contact SC2 composed of a contact layer, and first-layer interconnection AL1(a) to (k) composed of a first-interconnection layer. SRAM cell CELL1 has not a first via and layer information above a second-layer interconnection. The diffusion layer SDG is a region including the source and the drain of the transistor separated by a field region and the gate region. The gate GP is a region including a gate channel region and a gate interconnection region crossing to the diffusion layer SDG.

The N well region is formed in the center of the SRAM cell CELL1. The road PMOS transistors LPT1 and LPT2 are adjacently disposed in the N well region. The first P well region Pwell1 is formed adjacent to the N well region N well and above the SRAM cell CELL1. The driver NMOS transistors DNT1 and DNT3, the transfer NMOS transistors TRNT1 and TRNT3 are disposed in the first P well region Pwell1. The second P well region Pwell2 is formed adjacently at the N well region N well and under the SRAM cell CELL1. The driver NMOS transistor DNT2 and the transfer NMOS transistor TRNT2 are disposed in the second P well region Pwell2.

The diffusion layers SDG (a) to (e) are respectively a rectangular shape being parallel to X-axis and having a size of X direction being larger than that of Y direction. The diffusion layers SDG (a) to (e) are disposed as the five columns towards to the longitudinal direction and separately in parallel. Here, a size along the longitudinal direction of the diffusion layer SDG (c) forming the road PMOS transistor LPT1 and a size along the longitudinal direction of the diffusion layer SDG (d) forming the road PMOS transistor LPT2 are formed as the smallest size in the transistors. A size along the longitudinal direction of the diffusion layer SDG (b) forming the driver NMOS transistor DNT3 and the transfer NMOS transistor TRNT3 in the data-reading portion 3 is the largest size in the transistors. The reason mentioned above is to improve drive capability of the transistors by increasing β ratio (gate width size/gate length size).

Here, the diffusion layer SDG(c) and (d) having the PMOS transistor is disposed at the center of the SRAM cell CELL1. The diffusion layer SDG (a), (b) and (e) having the NMOS transistor are disposed at the upper region and the lower region of the SRAM cell CELL1. The diffusion layer SDG(c) and (d) are configured on the N well layer and are called a first diffusion layer. The diffusion layers SDG (a), (b) and (e) are configured on the P well layer and are called a second diffusion layer.

The gate GP (a) and the gate GP (b) are disposed parallel to Y-axis. A width along lateral direction of the gate GP(a) crossing to the diffusion layer SDG is identical to that of the gate GP(b) and the center line along longitudinal direction in the gate GP(a) is on the identical line of that in the gate GP(b). An interval between the center line of gate GP(a) (gate GP(b)) and the left end of the SRAM cell CELL1 is arranged with ½ pitch being Xa×(¼).

The gate GP(c) and gate GP (d) are disposed parallel to Y-axis. A width along lateral direction of the gate GP(c) crossing to the diffusion layer SDG is identical to that of the gate GP (d). Furthermore, a width along lateral direction of the gate GP(c) crossing to the diffusion layer SDG is as the same size as that of the gate GP (a) and the gate GP (b). A center line along the longitudinal direction of the gate GP(c) is identical to that of the gate GP (a) and the gate GP (b). An interval between the right end of the SRAM cell CELL1 and the center line of the gate GP(c) (the gate GP(d)) is arranged with ½ pitch being Xa×(¼). An interval between the center line of the gate GP (a) (the gate GP (b)) and that of the gate GP (c) (gate GP (d)) is arranged with one pitch being Xa×(½).

The contacts COT1 (a) to (g) and the contacts COT2 (a) to (e) are used as first-layer interconnection AL1 connecting the gate, the source and the drain of the transistor. The contact COT1 (a) to (g) have size redundancy to the diffusion layer SDG or the gate GP. The contact COT2 (a) to (e) are disposed as one of sides being adjacent to the diffusion layer SDG. The half of the area in each contact COT1 (a) to (g) and each contact COT2 (b) to (d) are disposed at the cell adjoining with SRAM cell CELL1. The reason mentioned above is for shrinking sizes along lateral direction and of longitudinal direction in the cell.

The shared contact SC1 is disposed for connecting between the gates of the road PMOS transistor LPT2 and the driver NMOS transistor DNT2 and the drains of the road PMOS transistor LPT1 and the driver NMOS transistor DNT1 and the transfer NMOS transistor TRNT1. The first-layer interconnection AL1 is not configured at a periphery area crossing to the gate GP (d).

A shared contact SC2 is disposed for connecting between the gates of the road PMOS transistor LPT1, the driver NMOS transistor DNT1 and the driver NMOS transistor DNT3, and the drain of the road PMOS transistor LPT2, the drain of the driver NMOS transistor DNT2 and the transfer NMOS transistor TRNT2. The first-layer interconnection AL1 is not configured at a periphery area crossing to the gate GP (a).

Here, an interval between the center line along Y-axis direction of the contact COT1(b), the contact COT1(c), the contact COT1(d) and the contact COT2(d), and the center line along Y-axis of the gates GP(a) and (b) are arranged with Xa×(¼) being ½ pitch. An interval between the center line along Y-axis direction of the gates GP(a) and (b), which are contacts of the source or the drain, and the center line along Y-axis direction of the contacts COT2(d) and (e) are arranged with ½ pitch being Xa×(¼). An interval between the center line along Y-axis direction of the contacts GP(c) and (d), which are contacts of the source or the drain, and center line along Y-axis direction of the gates GP(c) and (d) are arranged with ½ pitch being Xa×(¼). An interval between the center line along Y-axis direction of the contact COT2 (b) and the contact COT2(c), which are contacts of the source or the drain, and the center line along Y-axis direction of the contact COT1(e) and the contact COT1(f) is arranged with ½ pitch being Xa×(¼).

The first-layer interconnection AL1 (a) is used for connecting between the low potential power supply Vss and the source of the driver NMOS transistor DNT 1 and DNT 3. The first-layer interconnection AL1 (a) is connected with a first via (not illustrated) and another portion of the low potential power supply Vss by using layers being above a second-interconnection layer.

The first-layer interconnection AL1 (b) is used for connecting between the word line WL and the source of the transfer NMOS transistor TRN1 and 3. The first-layer interconnection AL1 (b) is connected with the first via (not illustrated) and another portion of the word line WL interconnection by using the layers being above the second-interconnection layer.

The first-layer interconnection AL1(c) is used for connecting between the bit line BL and the transfer NMOS transistor TRNT1. The first-layer interconnection AL1 (c) is connected with the first via (not illustrated) and another portion of the interconnection of the bit line BL by using the layers being above the second-interconnection layer.

The first-layer interconnection AL1 (d) is used for connecting between the gate of the road PMOS transistor LPT2 and the driver NMOS transistor DNT2 and the drain of the road PMOS transistor LPT1, the driver NMOS transistor DNT1 and the transfer NMOS transistor TRNT1.

The first-layers interconnection AL1 (e) is used for connecting between the bit line BL and the transfer NMOS transistor DNT3. The first-layer interconnection AL1 (e) is connected with the first via (not illustrated) and another portion of the interconnection of the bit line BL by using the layers being above the second-interconnection layer.

The first-layer interconnection AL1 (f) is used for connecting between the high potential power supply Vdd and the source of the road PMOS transistor LPT1. The first-layer interconnection AL1 (f) is connected with the first via (not illustrated) and another portion of the high potential power supply Vdd interconnection.

The first-layer interconnection AL1 (g) is used for connecting between the high potential power supply Vdd and the source of the road PMOS transistor LPT2. The first-layer interconnection AL1 (a) is connected with the first via (not illustrated) and another portion of the interconnection of the high potential power supply Vdd.

The first-layer interconnection AL1 (h) is used for connecting between the gates of the road PMOS transistor LPT1, the driver NMOS transistor DNT1 and the drain of driver NMOS transistor DNT3 and the drain of the road PMOS transistor LPT2, the driver NMOS transistor DNT2 and the transfer NMOS transistor TRNT2.

The first-layer interconnection AL1 (i) is used for connecting between the bit line/BL interconnection and the transfer NMOS transistor TRNT2. The first-layer interconnection AL1 (i) is connected with the first via (not illustrated) and another portion of the bit line/BL interconnection.

The first-layer interconnection AL1 (j) is used for connecting between the low potential power supply Vss and the source of the driver NMOS transistor DNT2. The first-layer interconnection AL1 (j) is connected with the first via (not illustrated) and another portion of the low potential power supply Vss.

The first-layer interconnection AL1 (k) is used for connecting between the word line WL and the gate of the transfer NMOS transistor TRN2. The first-layer interconnection AL1 (k) is connected with the first via (not illustrated) and another portion of the word line WL interconnection.

Here, the data-reading portion 3 is configure to a portion in the second column diffusion layer SDG(b) in the first embodiment, however, the data-reading portion 3 may be configured to a portion in the first column diffusion layer SDG(a). In this case, the contact COT2 (a) is configured to a portion in the second column diffusion layer SDG (b). When the contact COT2 (a) is configured to the first column diffusion layer SDG (a), electrical capacity of an inner node in the cell is increased as comparing with the case of being configured to the second column diffusion layer SDG (b).

As shown in FIG. 3, SRAM cell CELL1 composed of the plurality of SRAMs, each SRAM being repeatedly disposed, has four cells sharing the original point GM as a basic unit cell. Actually, the original point GM of the SRAM cell CELL1a is disposed at the lower left, the original point GM of the SRAM cell CELL1b is disposed at the lower right, the original point GM of the SRAM cell CELL1c is disposed at the upper left and the original point GM of SRAM cell CELL1d is disposed at the upper right. Further, a cell as an end point is disposed at an end of basic unit.

The high potential power supply Vdd interconnection the low potential power supply Vss interconnection, the bit line BL interconnection, the bit line/BL interconnection and the word line WL interconnection are derived from the interconnections being above the second interconnection via the first via disposed at a predetermined position in the SRAM cell CELL1.

As mentioned above, in the semiconductor memory of this embodiment, six transistors being composed of the data-retaining portion 2 and two transistors being composed of the data-reading portion 3 are configured in the SRAM cell CELL1 being composed of the SRAM. The SRAM cell CELL1 is the rectangular shape having the size along longitudinal direction being larger than that along the lateral direction. The SRAM cell CELL1 connects between the transistors by using the first-layer interconnection. In the layer being composed of the SRAM cell CELL1, five columns towards to the longitudinal direction are separately disposed in parallel. The gate GP having longer size along longitudinal direction than lateral direction in the layer is arranged with every ½ pitch of lateral direction crossing to the diffusion layer SDG. The contact of the source or the drain is formed apart along lateral direction of gate GP by ¼ pitch. The SRAM cell CELL1 being composed of the plurality of SRAMs, each SRAM being repeatedly disposed, has four cells sharing the original point GM as the basic unit cell. The interconnection of the high potential power supply Vdd, the interconnection of the low potential power supply Vss, the interconnection of the bit line BL, the interconnection of the bit line/BL and the interconnection of the word line WL are derived from the interconnections above the second interconnection via the first via disposed at a predetermined position in the SRAM cell CELL1.

Accordingly, this method mentioned above can suppress increase of a cell size as comparing with the conventional method, where a number of transistors composing the SRAM cell are increased. Furthermore, the position of the gate and the contact are disposed at a predetermined interval. That is, the cell unit including four SRAMs is repeatedly disposed in the SRAM cell. The SRAM cell can be freely interconnected by using interconnections being above the second-layer interconnection via first via. Therefore, the SRAM cell in this embodiment can be easily designed as comparing with the conventional case.

In this embodiment, the SRAM cell connects between the transistors by the first-layer interconnection, however, the SRAM cell may be connected by using the first-layer interconnection to m-th layer interconnection (m is an integral over 2). Further, in the position of the gate crossing to the diffusion layer, the size along lateral direction is identical to each other and the center line along longitudinal direction is on identical line to each other, however, the gate size (gate length Lg) may be form to be longer than another portion or to extend one side of the gate region. Further, the first embodiment is explained on layout of eight transistors in the SRAM cell having the data-reading portion composed of two NMOS transistor, however, the first embodiment can be applied to designing layout on the data-reading portion having eight transistors in the SRAM cell including above three NMOS transistors or one NMOS transistor.

What is claimed is:

1. A semiconductor static random access memory device, comprising:
a first inverter being composed of a first P-channel MOS transistor formed at a high potential power supply side and a first N-channel MOS transistor formed at a low potential power supply side;
a second inverter being composed of a second P-channel MOS transistor formed at the high potential power supply side and a second N-channel transistor formed at the low potential power supply side, an input of the second inverter connecting with an output of the first inverter, an output of the second inverter connecting with an input of the first inverter;
a data-retaining portion having a third N-channel MOS transistor, a fourth N-channel MOS transistor, a fifth N-channel MOS transistor and a sixth N-channel MOS transistor, the third N-channel MOS transistor having a source connecting with the output of the first inverter, a drain connecting with a first bit line and a gate connecting with a word line, and the fourth N-channel MOS transistor having a source connecting with the output of the second inverter, a drain connecting with a second bit line paired with the first bit line and a gate connecting with the word line, a drain of the fifth N-channel MOS transistor connecting with the first bit line, a gate of the fifth N-channel MOS transistor connecting with the word line, a drain of the sixth N-channel MOS transistor connecting with the source of the fifth N-channel MOS transistor, a source of the sixth N-channel MOS transistor connecting with the low potential power supply and a gate of the sixth N-channel MOS transistor connecting with the output of the second inverter;
a data-reading portion having a first group of transistors including at least one N-channel MOS transistor, data-reading portion reading out data stored in the data-retaining portion via the first bit line;
a first P-well region including the first N-channel MOS transistor, the third N-channel MOS transistor and the first group of transistors;
a second P-well region including the second N-channel MOS transistor and the fourth N-channel MOS transistor; and
an N-well region being interposed between the first P-well region and the second P-well region, the N-well region adjoining the first group of transistors in the first P-well region, the N-well region having the first P-channel MOS transistor and the second P-channel MOS transistor, wherein gate widths of the fifth N-channel MOS transistor and the sixth N-channel MOS transistor, respectively, is lamer than gate widths of the first N-channel MOS transistor. the second N-channel MOS transistor, the third N-channel MOS transistor, the fourth N-channel MOS transistor, the first P-channel MOS transistor and the second P-channel MOS transistor. respectively.

2. The semiconductor static random access memory device, according to claim 1,
wherein gate lengths of the third N-channel MOS transistor, the fourth N-channel MOS transistor and the fifth N-channel MOS transistor, respectively, is larger than the gate lengths of the first N-channel MOS transistor, the second N-channel MOS transistor and the sixth N-channel MOS transistor, respectively.

3. A semiconductor static random access memory device, comprising:
a first inverter being composed of a first P-channel MOS transistor formed at a high potential power supply side and a first N-channel MOS transistor formed at a low potential power supply side;
a second inverter being composed of a second P-channel MOS transistor formed at the high potential power supply side and a second N-channel transistor formed at the low potential power supply side, an input of the second inverter connecting with an output of the first inverter, an output of the second inverter connecting with an input of the first inverter;

a data-retaining portion having a third N-channel MOS transistor and a fourth N-channel MOS transistor, the third N-channel MOS transistor having a source connecting with the output of the first inverter, a drain connecting with a first bit line and a gate connecting with a word line, and the fourth N-channel MOS transistor having a source connecting with the output of the second inverter, a drain connecting with a second bit line paired with the first bit line and a gate connecting with the word line;

a first data-reading portion having a first group of transistors including, a fifth N-channel MOS transistor and a sixth N-channel MOS transistor, a drain of the fifth N-channel MOS transistor connecting with the first bit line, a gate of the fifth N-channel MOS transistor connecting with the word line, a drain of the sixth N-channel MOS transistor connecting with the source of the fifth N-channel MOS transistor, a source of the sixth N-channel MOS transistor connecting with the low potential power supply and a gate of the sixth N-channel MOS transistor connecting with the output of the second inverter, the second data-reading portion have a seventh N-channel MOS transistor and a eighth N-channel MOS transistor, a drain of the seventh N-channel MOS transistor connecting with the first bit line, a gate of the fifth N-channel MOS transistor connecting with the word line, a drain of the eighth N-channel MOS transistor connecting with the source of the seventh N-channel MOS transistor, a source of the eighth N-channel MOS transistor connecting with the low potential power supply and a gate of the eighth N-channel MOS transistor connecting with the output of the second inverter, the first data-reading portion reading out data stored in the data-retaining portion via the first bit line;

a second data-reading portion having a second group of transistors including a seventh N-channel MOS transistor and a eighth N-channel MOS transistor, a drain of the seventh N-channel MOS transistor connecting with the first bit line, a gate of the fifth N-channel MOS transistor connecting with the word line, a drain of the eighth N-channel MOS transistor connecting with the source of the seventh N-channel MOS transistor, a source of the eighth N-channel MOS transistor connecting with the low potential power supply and a gate of the eighth N-channel MOS transistor connecting with the output of the second inverter, the second data-reading portion reading data stored in the data-retaining portion via the second bit line;

a first P-well region including the first N-channel MOS transistor, the third N-channel MOS transistor and the first group of transistors;

a second P-well region including the second N-channel MOS transistor, the fourth N-channel MOS transistor and the second group of transistors; and an N-well region being interposed between the first P-well region and the second P-well region, the N-well region adjoining the first group of transistors in the first P-well region and the second group of transistors in the second P-well region, the N-well region having the first P-channel MOS transistor and the second P-channel MOS transistor, wherein gate widths of the fifth N-channel MOS transistor, the sixth N-channel MOS transistor, the seven N-channel MOS transistor and the eighth N-channel MOS transistor, respectively, is larger than gate widths of the first N-channel MOS transistor, the second N-channel MOS transistor, the third N-channel MOS transistor, the fourth N-channel MOS transistor, the first P-channel MOS transistor and the second P-channel MOS transistor, respectively.

4. The semiconductor static random access memory device, according to claim 3, wherein gate lengths of the third N-channel MOS transistor, the fourth N-channel MOS transistor, the fifth N-channel MOS transistor and the seventh N-channel MOS transistor, respectively, is larger than the gate size of the first N-channel MOS transistor, gate lengths of the second N-channel MOS transistor, the sixth N-channel MOS transistor and the gate size of eighth N-channel MOS transistor, respectively.

* * * * *